US012538504B2

(12) United States Patent
Akiyama et al.

(10) Patent No.: US 12,538,504 B2
(45) Date of Patent: Jan. 27, 2026

(54) FILM FORMATION METHOD

(71) Applicant: Tokyo Electron Limited, Tokyo (JP)

(72) Inventors: Koji Akiyama, Nirasaki (JP); Hajime Nakabayashi, Nirasaki (JP); Akinobu Kakimoto, Nirasaki (JP); Nobutake Kabuki, Nirasaki (JP); Yumiko Kawano, Nirasaki (JP); Sara Otsuki, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 390 days.

(21) Appl. No.: 18/246,391

(22) PCT Filed: Sep. 10, 2021

(86) PCT No.: PCT/JP2021/033233
§ 371 (c)(1),
(2) Date: Mar. 23, 2023

(87) PCT Pub. No.: WO2022/065064
PCT Pub. Date: Mar. 31, 2022

(65) Prior Publication Data

US 2023/0361163 A1 Nov. 9, 2023

(30) Foreign Application Priority Data

Sep. 24, 2020 (JP) ................................ 2020-159694

(51) Int. Cl.
*H10D 1/68* (2025.01)
*C23C 16/455* (2006.01)

(52) U.S. Cl.
CPC ....... *H10D 1/692* (2025.01); *C23C 16/45529* (2013.01)

(58) Field of Classification Search
CPC ... H10D 1/692; H01L 21/31; C23C 16/45529; C23C 16/405; C23C 16/448; C23C 16/06; C23C 16/40; C23C 16/4408; C23C 16/455; C23C 28/345; C23C 28/32
See application file for complete search history.

(56) References Cited

U.S. PATENT DOCUMENTS

2008/0072792 A1* 3/2008 Yanagisawa .......... C23C 16/409
106/287.18
2022/0102534 A1* 3/2022 Hamochi .......... H01L 21/02211

FOREIGN PATENT DOCUMENTS

JP 2012-080094 A 4/2012
WO 2020-066819 A1 4/2020

* cited by examiner

*Primary Examiner* — Thanh Y. Tran
(74) *Attorney, Agent, or Firm* — Armstrong Teasdale LLP

(57) ABSTRACT

This film formation method comprises: a first film formation step; a second film formation step; and a third film formation step. In the first film formation step, a dielectric film is formed on a first conductive film. In the second film formation step, a metal oxide film is formed on the dielectric film. In addition, in the second film formation step, a metal oxide film is formed using heated oxygen gas and a vapor of an organic metal compound. In the third film formation step, a second conductive film is formed on the metal oxide film.

12 Claims, 5 Drawing Sheets

FILM FORMATION METHOD

CROSS-REFERENCE TO RELATED APPLICATIONS

The present application is a U.S. National Stage Entry of International Patent Application No. PCT/JP2021/033233, filed Sep. 10, 2021, which claims the benefit of priority to Japanese Patent Application No. 2020-159694, filed Sep. 24, 2020, each of which is hereby incorporated herein by reference in its entirety.

TECHNICAL FIELD

Various aspects and embodiments of the present disclosure relate to a film forming method.

BACKGROUND

For example, Patent Document 1 discloses a capacitor having a structure in which a zirconium oxide film and a titanium oxide film are sandwiched between titanium nitride electrodes. In Patent Document 1, the titanium oxide film is formed on the zirconium oxide film through an atomic layer deposition (ALD) method by using titanium tetraisopropoxide (TTIP: $Ti(OCHMe_2)_4$) as a precursor and ozone gas as an oxidizing gas.

PRIOR ART DOCUMENT

Patent Document

Patent Document 1: Japanese Patent Laid-Open Publication No. 2012-80094

The present disclosure provides a film forming method capable of manufacturing a capacitor having a small leak current.

SUMMARY

An aspect of the present disclosure relates to a film forming method including a first film forming process, a second film forming process, and a third film forming process. In the first film forming process, a dielectric film is formed on a first conductive film. In the second film forming process, a metal oxide film is formed on the dielectric film. In addition, in the second film forming process, the metal oxide film is formed by using heated oxygen gas and vapor of an organometallic compound. In the third film forming process, a second conductive film is formed on the metal oxide film.

According to various aspects and embodiments of the present disclosure, it is possible to manufacture a capacitor having a small leak current.

DETAILED DESCRIPTION

Hereinafter, embodiments of a film forming method disclosed herein will be described in detail with reference to the drawings. The film forming method disclosed herein is not limited by the following embodiments.

Ozone gas, which is used for forming a metal oxide film such as a titanium oxide film on a dielectric film such as a zirconium oxide film, has a strong oxidizing power. Thus, the zirconium oxide film or a conductive film below the zirconium oxide film is also oxidized. When the conductive film below the zirconium oxide film is oxidized, a conductivity of the conductive film is lowered, whereby a capacity as a capacitor may be lowered or a function as a capacitor may be lost.

Therefore, the present disclosure provides a technique capable of manufacturing a capacitor having a small leak current.

[Film Forming Method and Film Forming Apparatus]

Figure 1:
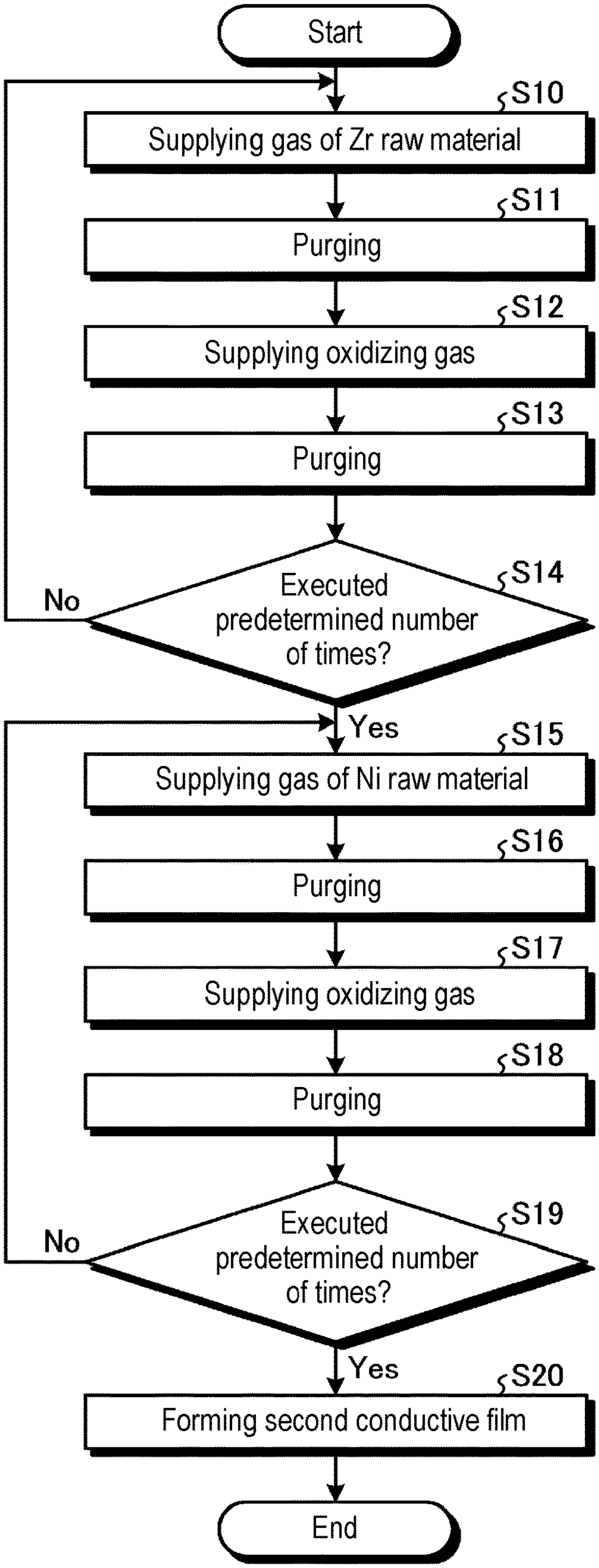
FIG. 1 is a flowchart illustrating an example of a film forming method according to an embodiment of the present disclosure.
Figure 2:
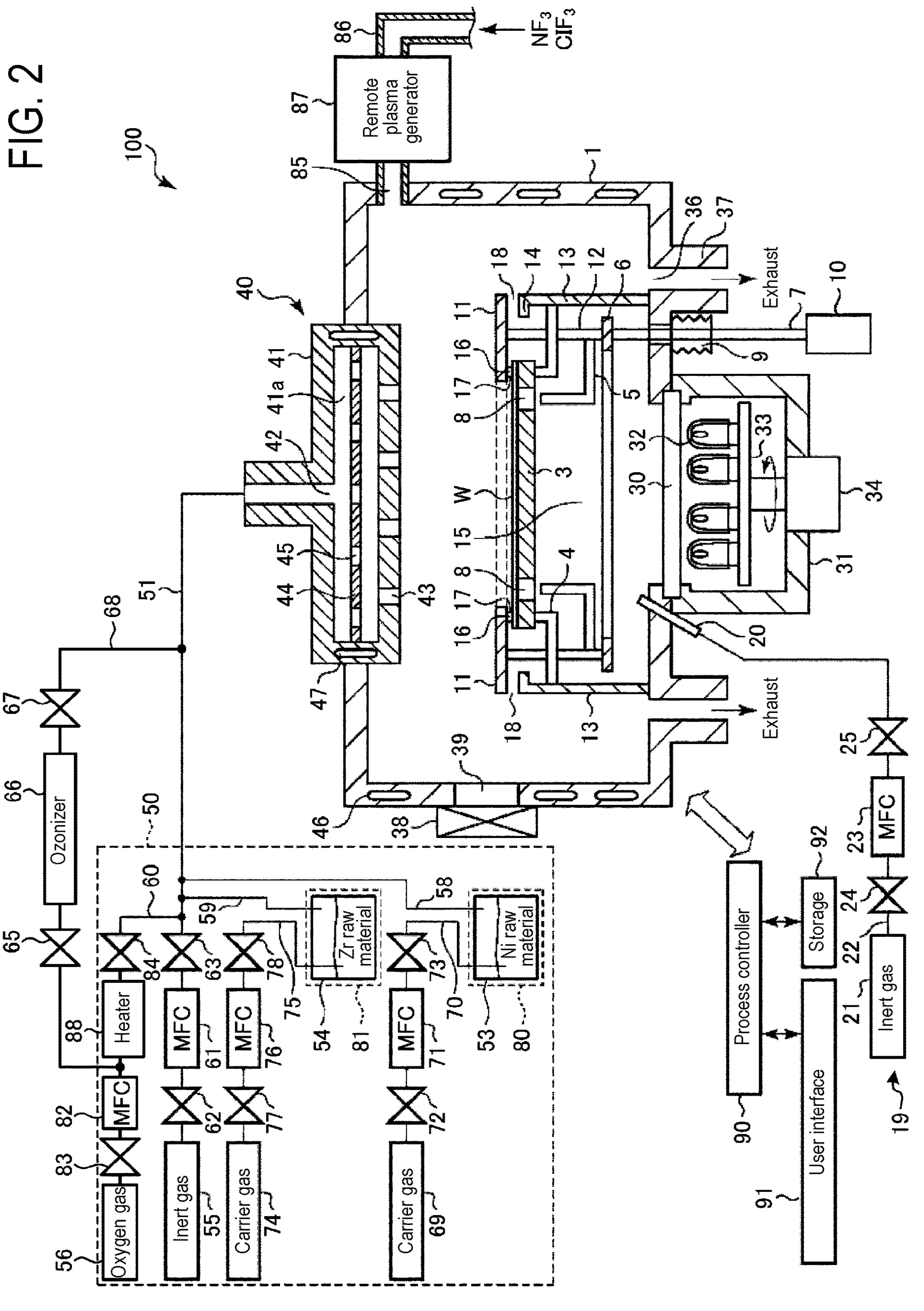
FIG. 2 is a schematic cross-sectional view illustrating an example of a film forming apparatus according to an embodiment of the present disclosure.

FIG. 1 is a flowchart illustrating an example of a film forming method according to an embodiment of the present disclosure. The processing illustrated in the flowchart of FIG. 1 is executed by, for example, a film forming apparatus 100 illustrated in FIG. 2. FIG. 2 is a schematic cross-sectional view illustrating an example of the film forming apparatus 100 according to an embodiment of the present disclosure.

The film forming apparatus 100 according to the present embodiment includes a processing container 1 made of, for example, aluminum or the like and formed into a cylindrical shape or a box shape. A stage 3 on which a substrate W is placed is provided in the processing container 1. The stage 3 is made of a carbon material such as a graphite plate or a graphite plate covered with silicon carbide, ceramics having a good thermal conductivity such as aluminum nitride, or the like.

On an outer peripheral side of the stage 3, a cover 13 made of aluminum or the like and formed into a substantially cylindrical shape to cover the stage 3 is provided. At an upper end of the cover 13, a bent portion 14 bent in a horizontal direction, for example, in an L shape is formed. A space surrounded by the stage 3 and the cover 13 constitutes a purge chamber 15. A top surface of the bent portion 14 is substantially on the same plane as a top surface of the stage 3, and is distanced from an outer periphery of the stage 3. Connecting rods 12 are inserted through a gap between the stage 3 and the bent portion 14. The stage 3 is supported by three support arms 4 extending from an upper inner wall of the cover 13. Two of the three support arms 4 are illustrated in FIG. 2.

Below the stage 3, a plurality of (e.g., three) L-shaped lifter pins 5 is provided to protrude upward from a ring-shaped support 6. Two of the three lifter pins 5 are illustrated in FIG. 2. The support 6 is configured to be raised and lowered by a lifting rod 7 that penetrates from a bottom of the processing container 1. The lifting rod 7 is driven upward and downward by an actuator 10 provided below the processing container 1.

Holes 8 penetrating the stage 3 are provided in portions of the stage 3 corresponding to the lifter pins 5. When the actuator 10 raises the lifter pins 5 via the lifting rod 7 and the support 6, the lifter pins 5 can be inserted through the holes 8 to raise the substrate W. A portion of the lifting rod 7 inserted into the processing container 1 is covered with a bellows 9 to prevent external air from entering the processing container 1 via the portion of the lifting rod 7 inserted into the processing container 1.

At a peripheral edge portion of the stage 3, a substantially ring-shaped clamp ring 11 along a contour shape of the substrate W is provided to hold a peripheral edge portion of the substrate W and fix the substrate W to the stage 3. The clamp ring 11 is made of ceramics such as aluminum nitride. The clamp ring 11 is connected to the support 6 via the connecting rods 12 and configured to move up and down integrally with the lifter pins 5. The lifter pins 5, the connecting rods 12, and the like are made of ceramics such as alumina.

A plurality of contact protrusions 16 is formed on a bottom surface of an inner peripheral portion of the ring-shaped clamp ring 11, and is disposed at substantially equal intervals along a circumferential direction. When clamping the substrate W, lower end surfaces of the contact protrusions 16 are brought into contact with a top surface of the peripheral edge portion of the substrate W and press the substrate W, whereby the substrate W is clamped. Gaps 17 between adjacent contact protrusions 16 are in communication with a purge chamber 15 below the stage 3.

A gap 18 between an outer peripheral edge portion of the clamp ring 11 and the bent portion 14 of the cover 13 is in communication with the purge chamber 15. An inert gas supplied to the purge chamber 15 flows into a processing space via the gaps 17 between adjacent contact protrusions 16 of the clamp ring 11 and the gap 18 between clamp ring 11 and the bent portion 14.

At the bottom of the processing container 1, a gas supply 19 configured to supply the inert gas into the purge chamber 15 is provided. The gas supply 19 includes a nozzle 20, a gas source 21, a pipe 22, a mass flow controller (MFC) 23, a valve 24, and a valve 25. The nozzle 20 supplies the inert gas such as argon gas into the purge chamber 15. The gas source 21 is, for example, a source of the inert gas such as argon gas. The pipe 22 guides the inert gas from the gas source 21 to the nozzle 20. The MFC 23 as a flow controller, a valve 24, and a valve 25 are provided in the pipe 22. As the inert gas, other rare gases such as nitrogen gas or helium gas may be used instead of argon gas.

At the bottom of the processing container 1, a transmission window 30 made of quartz or the like is airtightly provided directly below the stage 3. A box-shaped heating chamber 31 is provided below the transmission window 30 to surround the transmission window 30. Inside the heating chamber 31, a plurality of lamps 32 is installed on a turntable 33 that also serves as a reflecting mirror. The turntable 33 is rotated by a motor 34 provided at a bottom of the heating chamber 31. As a result, heat rays emitted from the lamps 32 pass through the transmission window 30, and a bottom surface of the stage 3 is irradiated with the heat rays, whereby the stage 3 is heated.

In addition, an exhaust port 36 is provided at a peripheral edge portion of the bottom of the processing container 1, and an exhaust pipe 37 is connected to the exhaust port 36. An exhaust device such as a vacuum pump (not illustrated) is connected to the exhaust pipe 37. By exhausting a gas inside the processing container 1 via the exhaust port 36 and the exhaust pipe 37, an interior of the processing container 1 can be maintained at a predetermined degree of vacuum. An opening 39 for loading and unloading the substrate W is formed in a side wall of the processing container 1. The opening 39 is opened and closed by a gate valve 38.

A shower head 40 configured to introduce a gas into the processing container 1 is provided on a ceiling of the processing container 1 facing the stage 3. The shower head 40 is made of, for example, aluminum, and includes a main body 41 having a space 41*a* therein. A gas inlet 42 is provided in a ceiling of the main body 41. The gas inlet 42 is connected via a pipe 51 to a gas supply 50 configured to supply gases for use in a film forming process.

At a bottom of the main body 41, a plurality of gas holes 43 configured to eject the gas supplied into the main body 41 to the processing space in the processing container 1 is disposed over an entire surface, so that the gas can be ejected onto an entire surface of the substrate W. A diffusion plate 44 having a plurality of through-holes 45 is provided in the space 41*a* of the main body 41, so that the gas can be more uniformly supplied to the surface of the substrate W. In addition, a heater 46 and a heater 47 for temperature control are provided inside the side wall of the processing container 1 and inside a side wall of the shower head 40, respectively. The heater 46 and the heater 47 are configured to be capable of maintaining wall surfaces in contact with the gas supplied into the processing container 1 at a predetermined temperature.

The gas supply 50 includes a reservoir 53, a reservoir 54, a gas source 55, and a gas source 56. The reservoir 53 stores a nickel (Ni) raw material. In the present embodiment, the nickel raw material is, for example, $(EtCp)_2Ni$ (Bis(ethylcyclopentadienyl)nickel). $(EtCp)_2Ni$ contains nickel, which is a transition metal. In addition, $(EtCp)_2Ni$ contains a cyclopentadienyl group. $(EtCp)_2Ni$ is an example of an organometallic compound. The reservoir 54 stores a zirconium (Zr) raw material. In the present embodiment, the zirconium raw material is, for example, tetrakis(ethylmethylamino)zirconium (TEMAZ). The gas source 55 is a source of an inert gas such as argon gas used for diluting the gas supplied into the processing container 1. The gas source 56 is a source of oxygen gas for oxidizing metal.

The gas source 55 is connected to the pipe 51 via a valve 62, an MFC 61, and a valve 63. The reservoir 53 is connected to the pipe 51 via a pipe 58. In addition, the reservoir 54 is connected to the pipe 51 via a pipe 59. In addition, the gas source 56 is connected to the pipe 51 via a pipe 60. An MFC 82, a valve 83, a valve 84, and a heater 88 are provided in the pipe 60. The heater 88 heats the oxygen gas supplied from the gas source 56 to a temperature within a range of, for example, 150 degrees C. or higher and 350 degrees C. or lower.

In addition, a pipe 68 is provided between the pipe 60 between the MFC 82 and the heater 88, and the pipe 51. The pipe 68 is provided with a valve 65, an ozonizer 66, and a valve 67. The ozonizer 66 generates ozone gas from the oxygen gas supplied from the gas source 56. The ozone gas generated by the ozonizer 66 is supplied into the processing container 1 via the valve 67 and the pipe 51.

A carrier gas source 69 configured to supply a carrier gas such as argon gas is connected to the reservoir 53 via a pipe 70. An MFC 71, a valve 72, and a valve 73 are provided in the pipe 70. A carrier gas source 74 configured to supply a carrier gas is connected to the reservoir 54 via a pipe 75. An MFC 76, a valve 77, and a valve 78 are provided in the pipe 75.

A heater 80 is provided in the reservoir 53 so that in a state of being heated by the heater 80, the nickel raw material stored in the reservoir 53 is supplied to the processing container 1 by bubbling. A heater 81 is provided in the reservoir 54 to that in a state of being heated by the heater 81, the zirconium raw material stored in the reservoir 54 is supplied to the processing container 1 by bubbling. In addition, the pipes, the MFCs, the valves, and the like through which vaporized nickel raw material and zirconium raw material flow are heated by heaters (not illustrated).

In addition, in the present embodiment, flow rates of the nickel raw material and the zirconium raw material are controlled by the MFCs after the raw materials are vaporized by bubbling, but the technique disclosed herein is not limited thereto. For example, the flow rates of the nickel raw material and the zirconium raw material in liquid states may be controlled by the MFCs, and the nickel raw material and zirconium raw material with the controlled flow rates may be vaporized by bubbling and supplied into the processing container 1. In addition, in the present embodiment, the nickel raw material, the zirconium raw material, and the oxygen gas are supplied into the processing container 1 via the pipe 51, but the technique disclosed herein is not limited thereto. For example, the nickel raw material, the zirconium raw material, and the oxygen gas may be supplied into the processing container 1 via separate pipes, respectively.

In an upper portion of the side wall of the processing container 1, a gas introducer 85 configured to introduce a cleaning gas such as $NF_3$ gas or $ClF_3$ gas is provided. A pipe 86 configured to supply the cleaning gas is connected to the gas introducer 85. A remote plasma generator 87 is provided in the pipe 86. The cleaning gas supplied via the pipe 86 is plasmarized by the remote plasma generator 87, and plasma of the cleaning gas is supplied into the processing container 1 via the gas introducer 85. As a result, the interior of the processing container 1 is cleaned. Alternatively, the gas introducer 85 may be connected to the pipe 51 and supply the plasma of the cleaning gas into the processing container 1 via the shower head 40. As the cleaning gas, $F_2$ gas may also be used in addition to $NF_3$ gas and $ClF_3$ gas. When $ClF_3$ gas is used as the cleaning gas, plasmaless thermal cleaning may be performed without using remote plasma.

The film forming apparatus 100 includes a process controller 90 having a microprocessor and the like, and respective components of the film forming apparatus 100 are controlled by the process controller 90. The processor controller 90 is connected a user interface 91 including a keyboard for an operator to input commands for managing respective components of the film forming apparatus 100, a display configured to visualize and display an operating status of the respective component of the film forming apparatus 100, or the like. In addition, the process controller 90 is connected to a storage 92 configured to store control programs, process recipes, or the like for implementing various processes to be executed in the film forming apparatus 100 under a control of the process controller 90.

The process controller 90 reads the processing recipe or the like stored in the storage 92 in advance in response to an instruction or the like input via the user interface 91. Then, the process controller 90 causes the film forming apparatus 100 to execute a predetermined process by controlling respective components of the film forming apparatus 100 according to the read processing recipe or the like.

Figure 3:
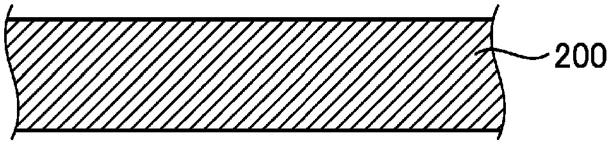
FIG. 3 is a schematic view illustrating an example of a process of manufacturing a capacitor.

Returning back to FIG. 1, the description will be continued. First, the gate valve 38 is opened, and the substrate W having a first conductive film 200 illustrated in FIG. 3, for example, is loaded into the processing container 1 and placed on the stage 3. In the present embodiment, the first conductive film 200 is made of, for example, titanium nitride. In addition, the first conductive film 200 may be made of tungsten, tungsten nitride, tantalum nitride, vanadium nitride, metal ruthenium, or the like. Then, the gate valve 38 is closed, and vapor of the zirconium raw material used for forming a zirconium oxide film is supplied into the processing container 1 (step S10).

In step S10, the valve 77 and the valve 78 are opened, and the carrier gas is supplied at a predetermined flow rate into the reservoir 54 by the MFC 76. Thus, the zirconium raw material is vaporized, and the vapor of the zirconium raw material is supplied via the pipe 51 into the processing container 1 at a flow rate according to the carrier gas with the flow rate controlled by the MFC 76. As a result, molecules of the zirconium raw material are adsorbed to a surface of the first conductive film 200. Then, the valve 77 and the valve 78 are closed.

Main conditions of step S10 are as follows.

Pressure in the processing container 1: 1 Torr

Temperature of the substrate W: 250 degrees C.

Processing time: 5 seconds

Subsequently, the surface of the substrate W is purged (step S11). In step S11, the valve 62 and the valve 63 are opened, and the inert gas is supplied at a predetermined flow rate by the MFC 61 into the processing container 1 via the pipe 51. As a result, the molecules of the zirconium raw material excessively adsorbed to the surface of the first conductive film 200 are removed. Then, the valve 62 and the valve 63 are closed.

Main conditions of step S11 are as follows.

Pressure in the processing container 1: 1 Torr

Temperature of the substrate W: 250 degrees C.

Flow rate of the inert gas: 500 sccm

Processing time: 10 seconds

Subsequently, the oxidizing gas is supplied to the surface of the substrate W (step S12). In step S12, the valve 83, the valve 65, and the valve 67 are opened, and oxygen gas is supplied to the ozonizer 66 at a predetermined flow rate by the MFC 82. The ozonizer 66 generates ozone gas from the supplied oxygen gas and supplies the generated ozone gas into the processing container 1 via the pipe 51. As a result, the molecules of the zirconium raw material adsorbed to the surface of the first conductive film 200 are oxidized, and a zirconium oxide film is formed on the surface of the first conductive film 200. Then, the valve 83, the valve 65, and the valve 67 are closed.

Main conditions of step S12 are as follows.

Pressure in the processing container 1: 1 Torr

Temperature of the substrate W: 250 degrees C.

Flow rate of the oxygen gas: 500 sccm

Concentration of the ozone gas: 100 g/cm3

Processing time: 10 seconds

Subsequently, the surface of the substrate W is purged again (step S13). In step S13, the valve 62 and the valve 63 are opened, and the inert gas is supplied at a predetermined flow rate by the MFC 61 into the processing container 1 via the pipe 51. As a result, a zirconium oxide film excessively deposited on the surface of the first conductive film 200 is removed. Then, the valve 62 and the valve 63 are closed. Main conditions of step S13 are the same as the main conditions of step S11.

Subsequently, it is determined whether steps S10 to S13 have been executed a predetermined number of times (step S14). The predetermined number of times in step S14 is the number of times a zirconium oxide film having a predetermined thickness is formed on the first conductive film 200. When steps S10 to S13 have not been executed the predetermined number of times (S14: "No"), the process illustrated in step S10 is executed again. The process of steps S10 to S14 is an example of a first film forming process.

Figure 4:
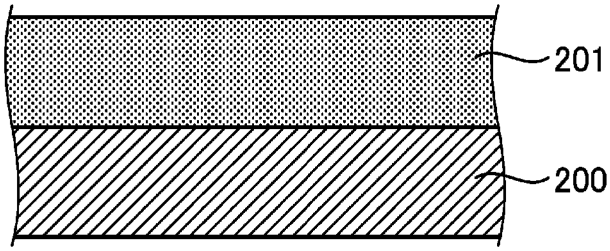
FIG. 4 is a schematic view illustrating an example of a process of manufacturing a capacitor.

On the other hand, when steps S10 to S13 have been executed the predetermined number of times (S14: "Yes"), as illustrated in FIG. 4, for example, a dielectric film 201 having a predetermined thickness is formed on the first conductive film 200. In the present embodiment, the dielectric film 201 is, for example, a zirconium oxide film. Then, vapor of the nickel raw material used for forming a nickel oxide film is supplied into the processing container 1 (step S15).

In step S15, the valve 72 and the valve 73 are opened, and the carrier gas is supplied into the reservoir 53 at a predetermined flow rate by the MFC 71. Thus, the nickel raw material is vaporized, and the vapor of the nickel raw material is supplied via the pipe 51 into the processing container 1 at a flow rate according to the carrier gas with the flow rate controlled by the MFC 71. As a result, molecules of the nickel raw material are adsorbed to a surface of the dielectric film 201. Step S15 is an example of an adsorption process. Then, the valve 72 and the valve 73 are closed.

Main conditions of step S15 are as follows.

Pressure in the processing container 1: 5 Torr

Temperature of the substrate W: 245 degrees C.

Processing time: 30 seconds

Subsequently, the surface of the substrate W is purged (step S16). In step S16, the valve 62 and the valve 63 are opened, and the inert gas is supplied at a predetermined flow rate by the MFC 61 into the processing container 1 via the pipe 51. As a result, the molecules of the nickel raw material excessively adsorbed to the surface of the dielectric film 201 are removed. Step S16 is an example of a first purge process. Then, the valve 62 and the valve 63 are closed.

Main conditions of step S16 are as follows.

Pressure in the processing container 1: 5 Torr

Temperature of the substrate W: 245 degrees C.

Flow rate of the inert gas: 500 sccm

Processing time: 30 seconds

Subsequently, the oxidizing gas is supplied to the surface of the substrate W (step S17). In step S17, the valve 83 and the valve 84 are opened, and oxygen gas is supplied to the heater 88 at a predetermined flow rate by the MFC 82. The oxygen gas supplied to the heater 88 is heated to a predetermined temperature by the heater 88. Then, the heated oxygen gas is supplied into the processing container 1 via the pipe 60 and the pipe 51. As a result, the molecules of the nickel raw material adsorbed to the surface of the dielectric film 201 are oxidized, and a nickel oxide film is formed on the surface of the dielectric film 201. Step S17 is an example of a reaction process. Then, the valve 83 and the valve 84 are closed.

Main conditions of step S17 are as follows.

Pressure in the processing container 1: 5 Torr

Temperature of the substrate W: 245 degrees C.

Flow rate of the oxygen gas: 500 sccm

Temperature of the oxygen gas: 150 degrees C. to 350 degrees C.

Processing time: 60 seconds

Here, when the molecules of the nickel raw material adsorbed to the surface of the dielectric film 201 are oxidized by using ozone gas, since the ozone gas has a stronger oxidizing power than oxygen gas, the first conductive film 200 below the dielectric film 201 may also be oxidized. When the first conductive film 200 is oxidized, the conductivity of the first conductive film 200 is lowered, and the capacity as a capacitor may be lowered or the function as a capacitor may be lost.

In contrast, in the present embodiment, in step S17, the molecules of the nickel raw material adsorbed to the surface of the dielectric film 201 are oxidized by using heated oxygen gas rather, instead of the ozone gas. As a result, it is possible to oxidize the molecules of the nickel raw material adsorbed to the surface of the dielectric film 201 without oxidizing the first conductive film 200 below the dielectric film 201. By heating the oxygen gas, it is possible to increase the oxidizing power of the oxygen gas. Thus, it is possible to oxidize the molecules of the nickel raw material adsorbed to the surface of the dielectric film 201 within a shorter time.

Although ozone gas is used in step S12 for forming the dielectric film 201, the first conductive film 200 is hardly oxidized because the processing time of step S12 is short.

Subsequently, the surface of the substrate W is purged again (step S18). In step S18, the valve 62 and the valve 63 are opened, and the inert gas is supplied at a predetermined flow rate by the MFC 61 into the processing container 1 via the pipe 51. As a result, the nickel oxide film excessively deposited on the surface of the dielectric film 201 is removed. Step S18 is an example of a second purging process. Then, the valve 62 and the valve 63 are closed. Main conditions of step S18 are the same as the main conditions of step S16.

Subsequently, it is determined whether steps S15 to S18 have been executed a predetermined number of times (step S19). When steps S15 to S18 have not been executed the predetermined number of times (S19: "No"), the process illustrated in step S15 is executed again. The process of steps S15 to S19 is an example of a second film forming process.

Figure 5:
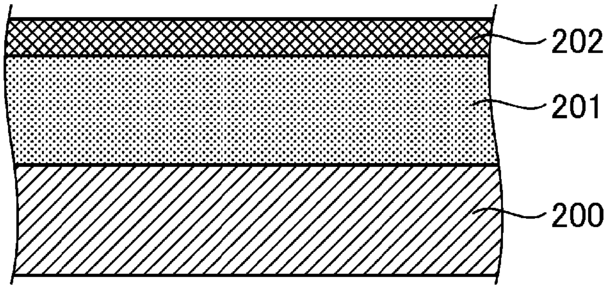
FIG. 5 is a schematic view illustrating an example of a process of manufacturing a capacitor.

On the other hand, when steps S15 to S18 have been executed the predetermined number of times (S19: "Yes"), as illustrated in FIG. 5, for example, a metal oxide film 202 having a predetermined thickness is formed on the dielectric film 201. In the present embodiment, the metal oxide film 202 is, for example, a nickel oxide film. Then, the gate valve 38 is opened and the substrate W is unloaded from the processing container 1.

Figure 6:
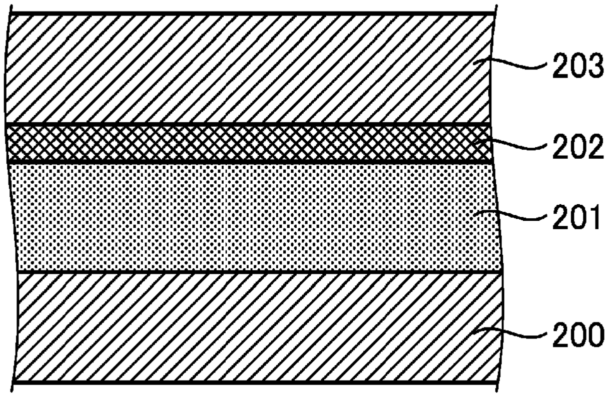
FIG. 6 is a schematic view illustrating an example of a process of manufacturing a capacitor.

Subsequently, the substrate W is loaded into a film forming apparatus (not illustrated) for forming a conductive film, and, for example, as illustrated in FIG. 6, a second conductive film 203 is formed on the metal oxide film 202 (step S20). Step S20 is an example of a third film forming process. In the present embodiment, the second conductive film 203 is made of, for example, titanium nitride. In addition, the second conductive film 203 may be made of tungsten, tungsten nitride, tantalum nitride, vanadium nitride, metal ruthenium, or the like. Thereafter, the film forming method illustrated in this flow chart is completed.

[Film Forming Rate]

Figure 7:
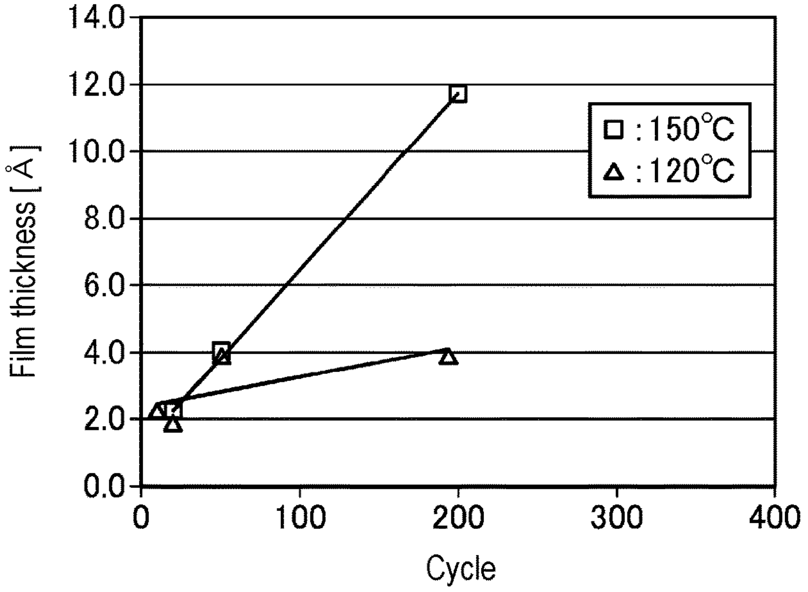
FIG. 7 is a diagram showing an example of a relationship between a temperature of oxygen gas and a film thickness of a metal oxide film.

FIG. 7 is a diagram showing an example of a relationship between a temperature of oxygen gas and a film thickness of a metal oxide film. The horizontal axis in FIG. 7 represents the number of repetitions (cycles) of steps S15 to S18 in FIG. 1, and the vertical axis represents a film thickness of the metal oxide film 202. For example, as shown in FIG. 7, by heating the oxygen gas to 120 degrees C. or higher, it is possible to form the metal oxide film 202 even when the oxygen gas is used.

However, in a case where the temperature of the oxygen gas is 120 degrees C., the metal oxide film 202 is formed to have a thickness of 4 angstroms only, even when the process of steps S15 to S18 is repeated 200 times. Therefore, from the viewpoint of improving throughput in forming the metal oxide film 202, the temperature of the oxygen gas is preferably heated to 150 degrees C. or higher.

In addition, as is clear from the result of FIG. 7, as the temperature of the oxygen gas increases, a film forming rate of the metal oxide film 202 increases. However, the nickel raw material decomposes at a temperature higher than 350 degrees C. and becomes difficult to be adsorbed to the surface of the dielectric film 201. As a result, when the oxygen gas is heated to a temperature higher than 350 degrees C., the film forming rate of the metal oxide film 202 decreases reversely. Therefore, the oxygen gas is preferably heated to a temperature within a range of 150 degrees C. or higher and 350 degrees C. or lower.

[Leak Current]

Figure 8:
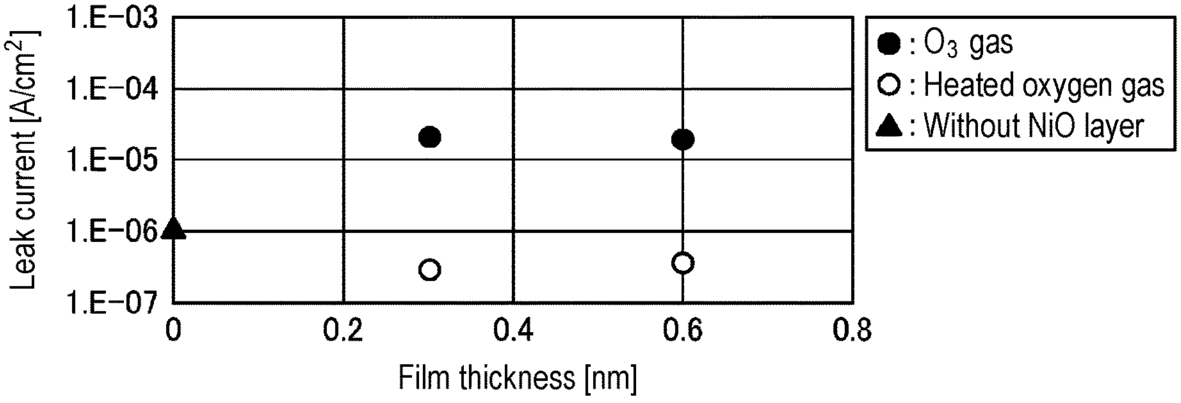
FIG. 8 is a diagram showing an example of a relationship between a film thickness of a metal oxide film and a leak current.

FIG. 8 is a diagram showing an example of a relationship between the film thickness of the metal oxide film 202 and a leak current. FIG. 8 shows leak current values of a capacitor in which the metal oxide film 202 is formed by using oxygen gas heated to 150 degrees C. by the film forming method of the present embodiment. FIG. 8 also shows, as a comparative example, leak current values of a capacitor in which only the dielectric film 201 is deposited between the first conductive film 200 and the second conductive film 203 and which does not have the metal oxide film 202 (a NiO layer). FIG. 8 also shows, as a comparative example, leak current values of a capacitor when the metal oxide film 202 is formed by using ozone gas.

As is clear from FIG. 8, the leak current values of the capacitor formed by the film forming method of the present embodiment are lower than the leak current values of the capacitor that does not have the metal oxide film 202. In addition, the leak current values of the capacitor formed by the film forming method of the present embodiment are by about double digits lower than the leak current values of the capacitor having the metal oxide film 202 formed by using ozone gas. Therefore, by forming the metal oxide film 202 between the dielectric film 201 and the second conductive film 203 by using heated oxygen gas, it is possible to suppress the leak current of the capacitor.

The embodiment has been described above. As described above, the film forming method in the present embodiment includes the first film forming process, the second film forming process, and the third film forming process. In the first film forming process, the dielectric film 201 is formed on the first conductive film 200. In the second film forming process, the metal oxide film 202 is formed on the dielectric film 201. In addition, in the second film forming process, the metal oxide film 202 is formed by using vapor of an organometallic compound and heated oxygen gas. In the third film forming process, the second conductive film 203 is formed on the metal oxide film 202. As a result, it is possible to manufacture a capacitor having a small leak current.

In addition, the second film forming process of the above-described embodiment includes the adsorption process, the first purge process, the reaction process, and the second purge process. In the adsorption process, the vapor of the organometallic compound is supplied to the surface of the dielectric film 201 so that molecules of the organometallic compound are adsorbed to the surface of the dielectric film 201. In the first purge process, the surface of the dielectric film 201 to which the organometallic compound molecules are adsorbed is purged with the inert gas. In the reaction process, by supplying heated oxygen gas to the surface of the dielectric film 201 to which the molecules of the organometallic compound are adsorbed, the molecules of the organometallic compound adsorbed to the surface of the dielectric film 201 are oxidized. In the second purge process, the surface of the dielectric film 201 on which the organometallic compound molecules are oxidized is purged with the inert gas. As a result, it is possible to form the metal oxide film 202 on the dielectric film 201

In addition, in the second film forming process of the above-described embodiment, the oxygen gas is heated to the temperature within the range of 150 degrees C. or higher and 350 degrees C. or lower. As a result, it is possible to oxidize the molecules of the organometallic compound adsorbed to the surface of the dielectric film 201 without oxidizing the first conductive film 200 below the dielectric film 201.

In the above-described embodiment, the organometallic compound includes a cyclopentadienyl group. The organometallic compound containing a cyclopentadienyl group is generally difficult to decompose. However, by heating the oxygen gas used for oxidation, it is possible to progress decomposition of the organometallic compound and to sufficiently oxidize the metal oxide film 202.

In the above-described embodiment, the first conductive film 200 and the second conductive film 203 are made of titanium nitride, tungsten, tungsten nitride, tantalum nitride, vanadium nitride, or metallic ruthenium. As a result, it is possible to manufacture a capacitor having a small leak current.

[Others]

The technique disclosed herein is not limited to the above-described embodiment, and various modifications are possible within the scope of the gist of the present disclosure.

For example, in the above-described embodiment, the organometallic compound supplied in step S15 includes nickel as a transition metal, but the technique disclosed herein is not limited thereto. The organometallic compound provided in step S15 may include cobalt, manganese, or other transition metals such as iridium.

In addition, in the above-described embodiment, in step S15, vapor of $(EtCp)_2Ni$ is supplied as the organometallic compound, but the technique disclosed herein is not limited thereto. In step S15, vapors of other organometallic compounds having hardly decomposable functional groups such as cyclopentadienyl groups (e.g., vapor of $(EtCp)_2Co$ or the like) may be supplied.

In addition, in the above-described embodiment, the dielectric film 201 is a zirconium oxide film, but the technique disclosed herein is not limited thereto. For example, the dielectric film 201 may be an oxide film containing at least one of zirconium, hafnium, aluminum, and titanium. In addition, the dielectric film 201 may be a multilayer film containing a layer of at least one of zirconium oxide, hafnium oxide, aluminum oxide, and titanium oxide.

It shall be understood that the embodiments disclosed herein are examples in all respects and are not restrictive. Indeed, the above-described embodiments can be implemented in various forms. The embodiments described above may be omitted, replaced, or modified in various forms without departing from the scope and spirit of the appended claims.

EXPLANATION OF REFERENCE NUMERALS

W: substrate, 100: film forming apparatus, 40: shower head, 50: gas supply, 51: pipe, 53: reservoir, 54: reservoir,

55: gas source, 56: gas source, 58: pipe, 59: pipe, 60: pipe, 61: MFC, 62: valve, 63: valve, 65: valve, 66: ozonizer, 67: valve, 68: pipe, 69: carrier gas source, 70: pipe, 71: MFC, 72: valve, 73: valve, 74: carrier gas source, 75: pipe, 76: MFC, 77: valve, 78: valve, 80: heater, 81: heater, 82: MFC, 83: valve, 84: valve, 85: gas introducer, 86 pipe, 87: remote plasma generator, 88: heater, 200: first conductive film, 201: dielectric film, 202: metal oxide film, 203: second conductive film

What is claimed is:

1. A film forming method comprising:

a first film forming process of forming a dielectric film on a first conductive film;

a second film forming process of forming a metal oxide film on the dielectric film; and a third film forming process of forming a second conductive film on the metal oxide film, wherein, in the second film forming process, the metal oxide film is formed by using heated oxygen gas and vapor of an organometallic compound, and wherein the second film forming process comprises:

an adsorption process of adsorbing molecules of the organometallic compound to a surface of the dielectric film by supplying the vapor of the organometallic compound to the surface of the dielectric film;

a first purge process of purging the surface of the dielectric film to which the molecules of the organometallic compound are adsorbed with an inert gas;

a reaction process of oxidizing the molecules of the organometallic compound adsorbed to the surface of the dielectric film by supplying the heated oxygen gas to the surface of the dielectric film to which the molecules of the organometallic compound are adsorbed; and a second purge process of purging the surface of the dielectric film to which the molecules of the organometallic compound are oxidized with the inert gas.

2. The film forming method of claim 1, wherein, in the second film forming process, the oxygen gas is heated to a temperature within a range of 150 degrees C. or higher and 350 degrees C. or lower.

3. The film forming method of claim 2, wherein the organometallic compound contains a transition metal.

4. The film forming method of claim 3, wherein the transition metal is nickel.

5. The film forming method of claim 4, wherein the organometallic compound contains a cyclopentadienyl group.

6. The film forming method of claim 5, wherein the dielectric film is an oxide film containing at least one of zirconium, hafnium, aluminum, and titanium.

7. The film forming method of claim 6, wherein the dielectric film is a multilayer film containing a layer of at least one of zirconium oxide, hafnium oxide, aluminum oxide, and titanium oxide.

8. The film forming method of claim 7, wherein the first conductive film and the second conductive film are titanium nitride, tungsten, tungsten nitride, tantalum nitride, vanadium nitride, or metallic ruthenium.

9. The film forming method of claim 1, wherein the organometallic compound contains a transition metal.

10. The film forming method of claim 1, wherein the organometallic compound contains a cyclopentadienyl group.

11. The film forming method of claim 1, wherein the dielectric film is an oxide film containing at least one of zirconium, hafnium, aluminum, and titanium.

12. The film forming method of claim 1, wherein the first conductive film and the second conductive film are titanium nitride, tungsten, tungsten nitride, tantalum nitride, vanadium nitride, or metallic ruthenium.

* * * * *